US011586084B2

(12) United States Patent
Ono et al.

(10) Patent No.: US 11,586,084 B2
(45) Date of Patent: Feb. 21, 2023

(54) LIQUID CRYSTAL DISPLAY PANEL

(71) Applicant: AGC Inc., Chiyoda-ku (JP)

(72) Inventors: Kazutaka Ono, Tokyo (JP); Yasumasa Kato, Tokyo (JP); Masaya Kunigita, Tokyo (JP)

(73) Assignee: AGC Inc., Chiyoda-ku (JP)

( * ) Notice: Subject to any disclaimer, the term of this patent is extended or adjusted under 35 U.S.C. 154(b) by 257 days.

(21) Appl. No.: 16/454,858

(22) Filed: Jun. 27, 2019

(65) Prior Publication Data

US 2019/0317376 A1    Oct. 17, 2019

Related U.S. Application Data

(63) Continuation of application No. 15/605,235, filed on May 25, 2017, now Pat. No. 10,386,686, which is a
(Continued)

(30) Foreign Application Priority Data

Nov. 28, 2014    (JP) .................................. 2014-241601

(51) Int. Cl.
    *B32B 15/04*    (2006.01)
    *B32B 17/06*    (2006.01)
    (Continued)

(52) U.S. Cl.
    CPC ........ *G02F 1/136286* (2013.01); *C03C 3/091* (2013.01); *C03C 17/36* (2013.01);
    (Continued)

(58) Field of Classification Search
    CPC ................................................ C03C 17/3605
    (Continued)

(56) References Cited

U.S. PATENT DOCUMENTS 7,833,919 B2 * 11/2010 Danielson ............... C03C 3/095
                                                      501/66
8,281,618 B2 * 10/2012 Kato ....................... C03C 3/083
                                                      65/95
(Continued)

FOREIGN PATENT DOCUMENTS

JP    2001-172041 A    6/2001
JP    2002-308643      10/2002
(Continued)

OTHER PUBLICATIONS

International Search Report dated Feb. 23, 2016 in PCT/JP2015/083464, filed on Nov. 27, 2015( with English Translation ).
(Continued)

*Primary Examiner* — Lauren R Colgan
(74) *Attorney, Agent, or Firm* — Oblon, McClelland, Maier & Neustadt, L.L.P.

(57) ABSTRACT

The present invention relates to a liquid crystal display panel having a predetermined size, containing a wiring film formed of a metal, an insulating film containing an inorganic substance and a substrate formed of a non-alkali glass, in which the metal has the product of a Young's modulus (E) and a thermal expansion coefficient ($\alpha$) at room temperature falling within a predetermined range, $\alpha$ of the inorganic substance is smaller than that of the non-alkali glass, the non-alkali glass has E of from 70 GPa to 95 GPa and $\alpha$ of from $32 \times 10^{-7}$ to $45 \times 10^{-7}$ (1/° C.) in which E and $\alpha$ satisfies a predetermined formula, and has a predetermined composition.

42 Claims, 4 Drawing Sheets

Figure 1A:
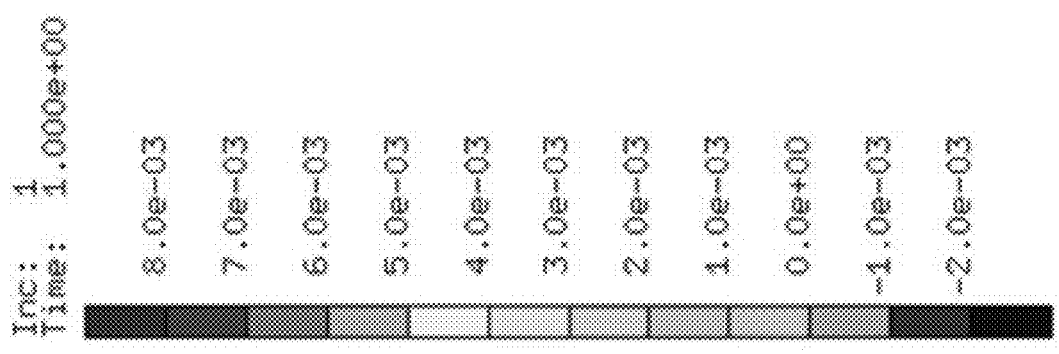

Related U.S. Application Data continuation of application No. PCT/JP2015/083464, filed on Nov. 27, 2015.

(51) Int. Cl.
    *G02F 1/1362*     (2006.01)
    *C03C 3/091*     (2006.01)
    *C03C 17/36*     (2006.01)
    *G02F 1/1333*     (2006.01)
    *G02F 1/1343*     (2006.01)
    *H01L 27/12*     (2006.01)
    *H01L 29/423*     (2006.01)

(52) U.S. Cl.
    CPC ...... *C03C 17/3605* (2013.01); *C03C 17/3626* (2013.01); *C03C 17/3649* (2013.01); *C03C 17/3671* (2013.01); *G02F 1/1343* (2013.01); *G02F 1/133302* (2021.01); *G02F 1/133345* (2013.01); *G02F 1/136295* (2021.01); *H01L 27/124* (2013.01); *H01L 29/42384* (2013.01)

(58) Field of Classification Search
    USPC .................................................. 428/428, 432
    See application file for complete search history.

(56) References Cited

U.S. PATENT DOCUMENTS

| | | | | |
|---|---|---|---|---|
| 9,505,650 | B2* | 11/2016 | Nishizawa | ............... C03C 3/091 |
| 2002/0151426 | A1 | 10/2002 | Murata et al. | |
| 2004/0203181 | A1* | 10/2004 | Shang | ............... H01L 29/66757 438/30 |
| 2013/0274086 | A1* | 10/2013 | Tsujimura | ............... C03C 3/087 501/71 |
| 2014/0366581 | A1* | 12/2014 | Tokunaga | ............... C03C 3/087 65/135.7 |
| 2015/0045203 | A1* | 2/2015 | Tokunaga | ............... C03C 3/091 501/67 |
| 2015/0299028 | A1 | 10/2015 | Nishizawa et al. | |
| 2015/0315065 | A1 | 11/2015 | Miwa et al. | |
| 2016/0068427 | A1 | 3/2016 | Tokunaga et al. | |

FOREIGN PATENT DOCUMENTS

| | | | |
|---|---|---|---|
| JP | 2010-118409 A | | 5/2010 |
| JP | 2013-253309 A | | 12/2013 |
| JP | 2014-118313 | | 6/2014 |
| JP | 2014-162659 A | | 9/2014 |
| WO | WO 2011/001920 A1 | | 1/2011 |
| WO | WO 2012/077609 A1 | | 6/2012 |
| WO | WO2013129368 | * | 9/2013 |
| WO | WO 2013/161902 | | 10/2013 |
| WO | WO2013161902 | * | 10/2013 |
| WO | WO 2013/183539 A1 | | 12/2013 |
| WO | WO 2013/183626 A1 | | 12/2013 |
| WO | WO 2014/087971 A1 | | 6/2014 |
| WO | WO2014087971 | * | 6/2014 |
| WO | WO 2015/080171 A1 | | 6/2015 |

OTHER PUBLICATIONS

Written Opinion dated Feb. 23, 2016 in PCT/JP2015/083464, filed on Nov. 27, 2015.

* cited by examiner

LIQUID CRYSTAL DISPLAY PANEL

CROSS REFERENCE TO RELATED APPLICATIONS

This application is a continuation of U.S. patent application Ser. No. 15/605,235, filed on May 25, 2017, the entire disclosure of which is incorporated herein by reference and which is a continuation application of PCT/JP2015/083464, filed on Nov. 27, 2015, the entire disclosure of which is incorporated herein by reference and which claims priority to Japanese Patent Application No. JP 2014-241601, filed on Nov. 28, 2014, the entire disclosure of which is incorporated herein by reference.

TECHNICAL FIELD

The present invention relates to a liquid crystal display panel. In detail, the present invention relates to a liquid crystal display panel containing a substrate formed of a predetermined non-alkali glass, and a pixel array formed thereon.

BACKGROUND ART

In recent years, in the process of becoming larger in size and higher in definition of a liquid crystal display panel, suppression of pattern misalignment of a pixel array due to heat treatment during a production process is one of the most important problems. A metal wiring of a semiconductor element array formed on a substrate becomes narrower by the demand of high definition, and as a result, the tolerance of pattern misalignment is getting smaller.

It is considered that pattern misalignment is caused by a thermal shrinkage due to structural relaxation of a glass substrate in a production process of a liquid crystal display panel. A first method proposed to suppress the thermal shrinkage is to decrease an average coefficient of thermal expansion of a glass. As glasses using this method are proposed a non-alkali glass having an average coefficient of thermal expansion at from 30° C. to 380° C. of from $25\times10^{-7}/°$ C. to $36\times10^{-7}/°$ C. (Patent Document 1) and a non-alkali glass having an average coefficient of thermal expansion at from 50° C. to 300° C. of from $30\times10^{-7}/°$ C. to $43\times10^{-7}/°$ C. (Patent Document 2). Furthermore, a glass having an average coefficient of thermal expansion close to that of a-Si, p-Si or the like film-formed on the glass substrate is also proposed (Patent Document 3).

A second method is to increase a strain point of a glass. Patent Document 1 proposes to increase a strain point to 640° C. or higher, Patent Document 2 proposes to increase a strain point to 710° C. or higher and lower than 725° C., and Patent Document 3 proposes to increase a strain point to 680° C. or higher and lower than 740° C.

In addition, to suppress deflection of a glass, it is proposed to decrease a density of a glass (Patent Documents 1, 2) or to increase Young's modulus (Patent Document 3).

PRIOR ART DOCUMENTS

Patent Documents

Patent Document 1: JP-A-2002-308643
Patent Document 2: WO2013/161902
Patent Document 3: JP-A-2014-118313

SUMMARY OF THE INVENTION

Problems that the Invention is to Solve

However, in the case where the maximum temperature of a heat treatment or the like in a production process is relatively low as about from 200° C. to 450° C., it is difficult to explain the pattern misalignment by the influence of structural relaxation of a glass. In fact, when the average coefficient of thermal expansion of a substrate glass is decreased, pattern misalignment becomes remarkably large in some cases.

In view of the above circumstances, an object of the present invention is to suppress pattern misalignment in a large-sized liquid crystal display panel having relatively low maximum temperature in a production process.

Means for Solving the Problems

The present invention provides an active matrix drive-type liquid crystal display panel, in which the liquid crystal display panel is produced by a production process including steps of film-forming a film formed of a metal on at least one surface of a substrate formed of a non-alkali glass, patterning the metal film obtained to form a wiring film, and then film-forming a gate insulating film containing an inorganic substance, in which the liquid crystal display panel containing the wiring film formed of the metal and the insulating film containing the inorganic substance are formed on the at least one surface of the substrate formed of the non-alkali glass.

Specifically, the present invention provides an active matrix drive-type liquid crystal display panel, in which the liquid crystal display panel contains a substrate formed of a non-alkali glass, and on at least one surface thereof, a wiring film obtained by film-forming a film formed of a metal and patterning the metal film and a gate insulating film containing an inorganic substance, the wiring film has a thickness of 0.1 µm or larger, the insulating film has a thickness of 100 nm or larger, the substrate has a long side of 1,800 mm or larger, a short side of 1,500 mm or larger, and a thickness of 0.5 mm or smaller, the metal has the product of a Young's modulus and a thermal expansion coefficient at room temperature of from $10,000\times10^{-7}$ GPa/° C. to $25,000\times10^{-7}$ GPa/° C., the inorganic substance has an average coefficient of thermal expansion (50° C. to 350° C.) smaller than that of the non-alkali glass, and the non-alkali glass has a Young's modulus (E) of from 70 GPa to 95 GPa and an average coefficient of thermal expansion (50° C. to 350° C.) α of from $32\times10^{-7}$ to $45\times10^{-7}$ (1/° C.), satisfies the following formula (1):

$$20\alpha + 7E \geq 1310 \qquad (1)$$

and has the following composition, in terms of mol % on the basis of oxides:

| | |
|---|---|
| $SiO_2$ | 66 to 74, |
| $Al_2O_3$ | 10 to 15, |
| $B_2O_3$ | 0.1 to 5, |
| MgO | 2 to 12, |
| CaO | 3 to 11, |
| SrO | 0 to 10, |
| BaO | 0 to 5, and |
| $ZrO_2$ | 0 to 2, | and has preferably the following composition, in terms of mol % on the basis of oxides:

| | |
|---|---|
| SiO$_2$ | 66 to 74, |
| Al$_2$O$_3$ | 10 to 15, |
| B$_2$O$_3$ | 0.1 to less than 3.0, |
| MgO | 2 to 10, |
| CaO | 3 to 11, |
| SrO | 0.1 to 10, |
| BaO | 0 to 5, and |
| ZrO$_2$ | 0 to 2. |

Advantageous Effects of the Invention

As a result of various investigations, the present inventors have found that influence of the combinations between a wiring film metal, an insulating film derivative and a substrate glass cannot be ignored in a large-sized liquid crystal display panel having relatively low maximum temperature (e.g., 450° C. or lower) of a heat treatment in a production process. Although not limitative of the present invention, it is considered that warpage of a glass substrate, not structural relaxation conventionally considered, is a major factor to cause pattern misalignment in the case where the maximum temperature of a heat treatment in a production process is relatively low. In the liquid crystal display panel of the present invention, pattern misalignment is remarkably suppressed by employing predetermined combinations of a glass constituting a substrate, a metal constituting a wiring, a dielectric substance constituting an insulating film, and a design embodiment of a display panel.

Figure 1B:
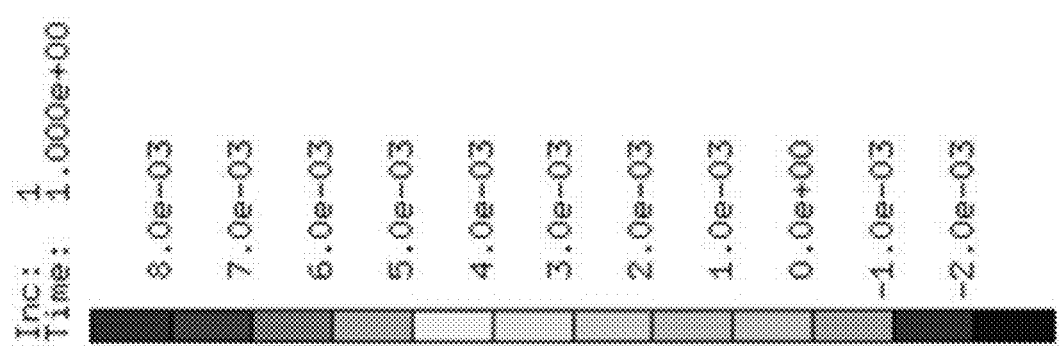
Figure 1C:
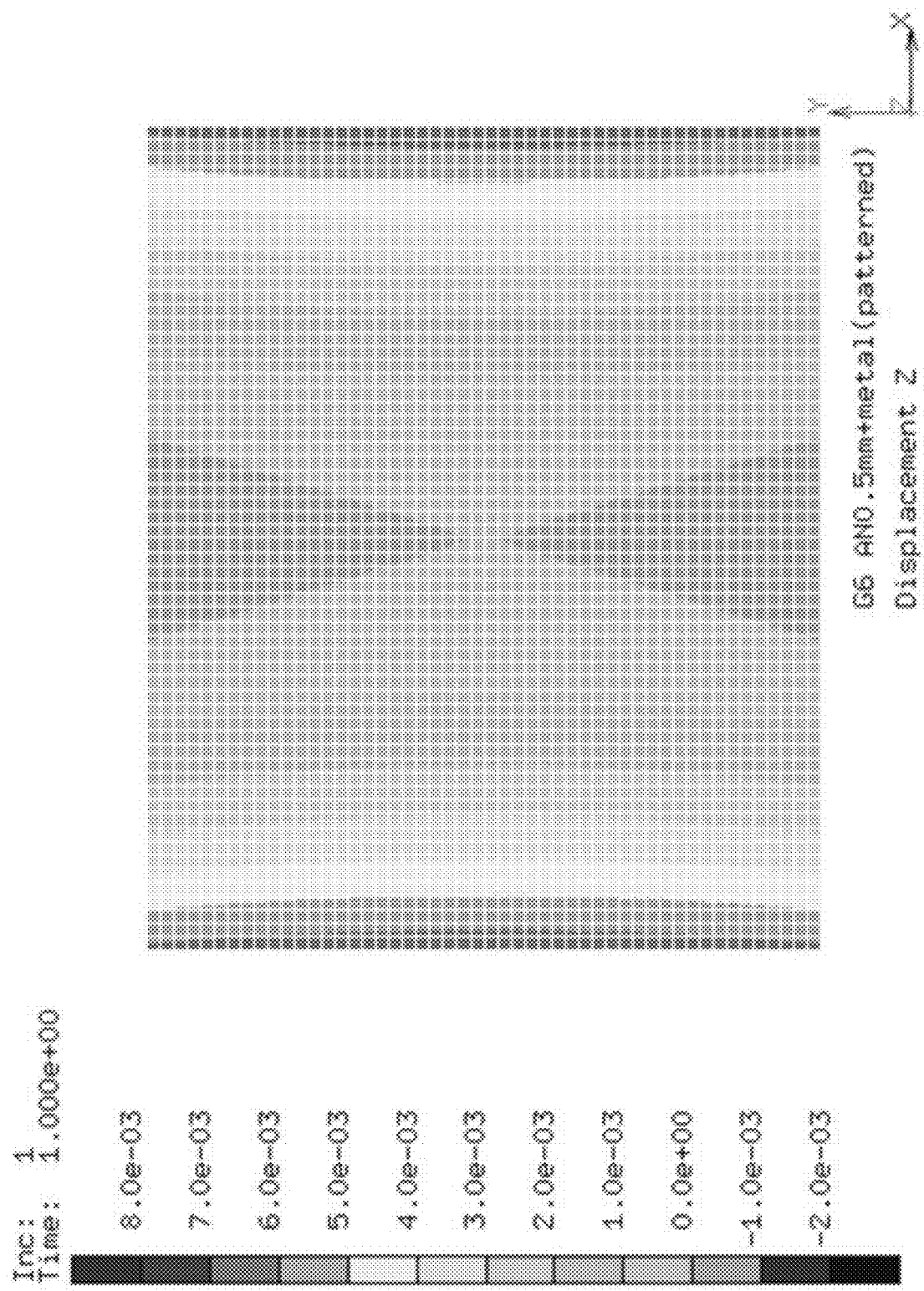

BRIEF DESCRIPTION OF THE DRAWINGS (a) to (c) of FIG. 1 are views illustrating deformation state of a glass substrate in Example 1; (a) is a view illustrating deformation state in step 1; (b) is a view illustrating deformation state in step 2; and (c) is a view illustrating deformation state in step 3.

Figure 2:
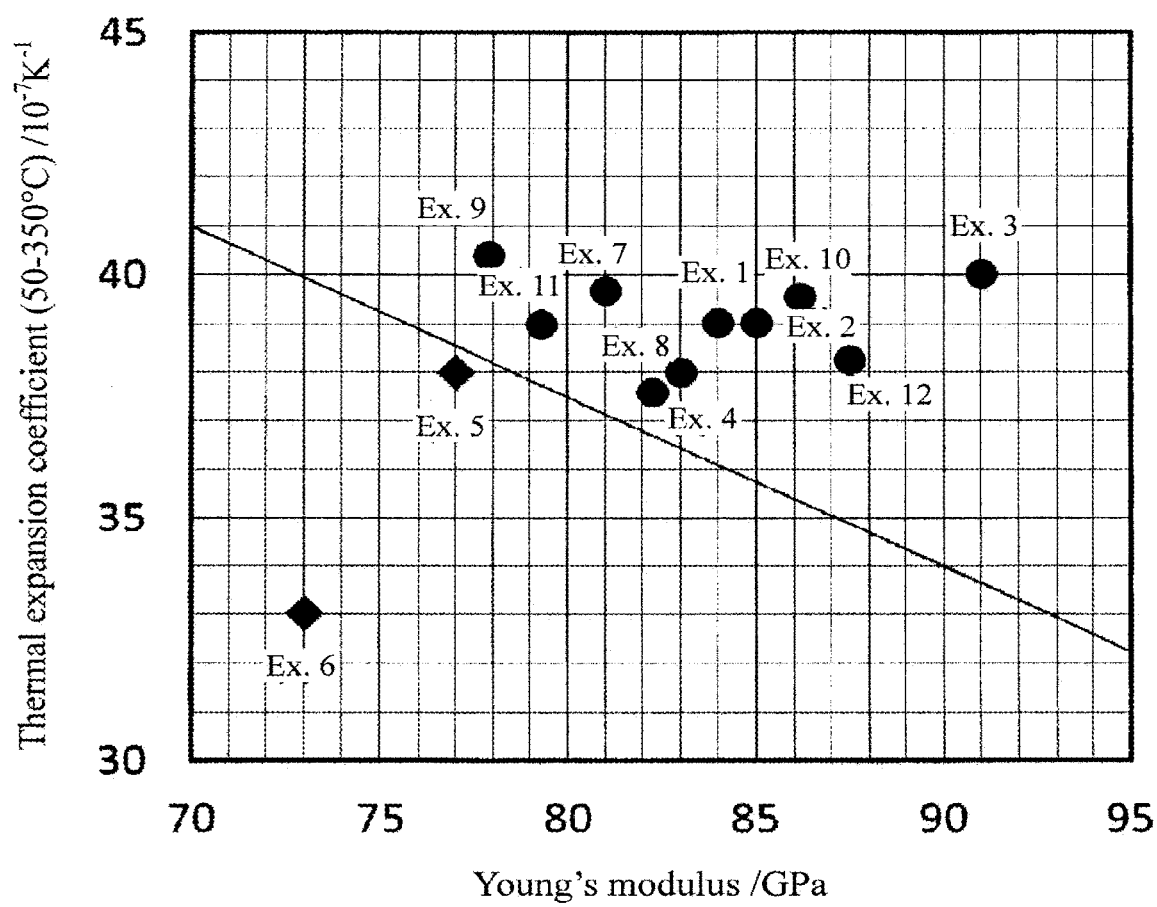

FIG. 2 is a graph obtained by plotting warpage of a substrate simulated in the cases where each of glasses prepared in Examples was used as a substrate, and a copper pattern having a predetermined film thickness and a silicon nitride film having a predetermined film thickness covering the copper pattern were forming on each substrate.

MODE FOR CARRYING OUT THE INVENTION

First, a non-alkali glass constituting a glass substrate in a liquid crystal display panel of the present invention is described. In the present invention, the term "non-alkali" glass means a glass that does not substantially contain an alkali metal oxide such as Na$_2$O and K$_2$O. The terms "does not substantially contain" used herein means that it is not contained except for unavoidable impurities (hereinafter the same). In the present invention, the amount of the alkali metal unavoidably contained is at most about 0.1 mol %.

The non-alkali glass contains a prescribed amount of an alkaline earth metal oxide and the like, in addition to SiO$_2$ and Al$_2$O$_3$ that form a frame network of the glass. The content of each of those components on the basis of oxides is described. Hereinafter, unless otherwise indicated, "%" means "mol %".

In the case where the content of SiO$_2$ is less than 66%, a strain point is not sufficiently high, and a thermal expansion coefficient and a specific gravity tend to excessively increase. For this reason, the content of SiO$_2$ is 66% or more, and preferably 66.5% or more. On the other hand, in the case where the content exceeds 74%, meltability is deteriorated such that a temperature (T$_2$) at which glass viscosity reaches 10$^2$ poises (dPa·s) increases and the like, thereby increasing a devitrification temperature, and Young's modulus tends to decrease. For this reason, the content of SiO$_2$ is 74% or less, preferably 73% or less, more preferably 72% or less, and still more preferably 71% or less.

Al$_2$O$_3$ has the effects of suppressing phase separation properties, improving a strain point and increasing Young's modulus. However, in the case where the content thereof is less than 10%, it is difficult to sufficiently achieve those effects. For this reason, the content of Al$_2$O$_3$ is 10% or more, preferably 11% or more, and more preferably 12% or more. On the other hand, in the case where the content exceeds 15%, T$_2$ increases thereby deteriorating meltability, and a devitrification temperature tends to increase. For this reason, the content of Al$_2$O$_3$ is 15% or less, preferably 14% or less, and more preferably 13% or less.

B$_2$O$_3$ is an essential component having the effects of improving meltability of a glass and decreasing a devitrification temperature thereof. However, in the case where its amount exceeds 5%, Young's modulus tends to decrease excessively and a thermal expansion coefficient tends to decrease excessively. For this reason, the content of B$_2$O$_3$ is 5% or less, preferably 4% or less, more preferably less than 3%, still more preferably 2.7% or less, further preferably 2.5% or less, still further preferably 2.0% or less, and particularly preferably 1.5% or less. On the other hand, in the case where the content is less than 0.1%, meltability is deteriorated, and it is difficult to obtain a homogeneous glass. For this reason, the content of B$_2$O$_3$ is 0.1% or more, preferably 0.2% or more, more preferably 0.3% or more, and still more preferably 0.5% or more.

MgO has the effects of improving meltability and decreasing specific gravity without excessively increasing a thermal expansion coefficient and without greatly decreasing a strain point. However, in the case where its content is less than 2%, these effects are not sufficiently achieved. For this reason, the content of MgO is 2% or more, preferably 3% or more, and more preferably 4% or more. On the other hand, in the case where the content exceeds 12%, a devitrification temperature increases. For this reason, the content of MgO is 12% or less, preferably 10% or less, more preferably 9.5% or less, and still more preferably 9% or less.

CaO has the effects of improving meltability, increasing Young's modulus and decreasing a devitrification temperature without excessively increasing a thermal expansion coefficient and without greatly decreasing a strain point. However, in the case where its content is less than 3%, these effects are not sufficiently achieved. For this reason, the content of CaO is 3% or more, preferably 4% or more, and more preferably 5% or more. On the other hand in the case where the content exceeds 11%, a devitrification temperature increases, and there is a possibility that the amount of phosphorus that is an impurity in limestone (CaCO$_3$) that is a raw material of CaO increases. For this reason, the content of CaO is 11% or less, preferably 10% or less, more preferably 9% or less, and still more preferably 8% or less.

SrO is not an essential component, but has the effect of improving meltability without increasing a devitrification temperature. To obtain the effect of relatively increasing a thermal expansion rate, the content of SrO is preferably 0.1% or more, more preferably 1% or more, and still more preferably 2% or more. On the other hand, in the case where the content exceeds 10%, specific gravity and a thermal expansion coefficient tend to increase excessively. For this reason, the content of SrO is 10% or less, preferably 8% or less, more preferably 7% or less, and still more preferably 6% or less.

BaO is not an essential component, but has the effects of improving meltability and improving devitrification resistance. Therefore, BaO may be contained in an amount of 5% or less. However, in the case where the content exceeds the amount, density tends to increase. The content is preferably 4.5% or less, more preferably 4% or less, still more preferably 1% or less, and particularly preferably 0.5% or less, and most preferred is that it is not substantially contained.

$ZrO_2$ is also not an essential component, but has the effects of decreasing a melting temperature and accelerating crystal deposition during firing. Therefore, $ZrO_2$ may be contained in an amount of 2% or less. However, in the case where the content exceeds the amount, devitrification resistance of a glass is deteriorated, and a dielectric constant ($\epsilon$) tends to increase. For this reason, the content is preferably 1.5% or less, more preferably 1% or less, and still more preferably 0.5% or less, and most preferred is that it is not substantially contained.

In the non-alkali glass of the present invention, in the case where the total (mol %) of alkaline earth metal oxides, that is, the total amount of MgO, CaO, SrO, and BaO, is less than 15%, Young's modulus decreases, and meltability tends to be deteriorated. For this reason, the total amount is preferably 15% or more, more preferably 16% or more and still more preferably 17% or more. On the other hand, in the case where the total amount exceeds 21%, a thermal expansion coefficient tends to increase excessively. For this reason, the total amount is preferably 20% or less, more preferably 19% or less and still more preferably 18% or less.

It is preferred that between MgO and other alkaline earth metals, those contents satisfy the following three requirements. By satisfying these requirements, a strain point can be increased without increasing a devitrification temperature, and additionally a viscosity of a glass, particularly a temperature $T_4$ at which a glass viscosity reaches $10^4$ dPa·s can be decreased.

MgO/(MgO+CaO+SrO+BaO) is preferably 0.20 or more, more preferably 0.25 or more, still more preferably 0.3 or more, particularly preferably 0.4 or more, and most preferably 0.45 or more.

MgO/(MgO+CaO) is preferably 0.3 or more, more preferably 0.4 or more, still more preferably 0.52 or more, particularly preferably 0.55 or more, and most preferably 0.6 or more.

MgO/(MgO+SrO) is preferably 0.6 or more, more preferably 0.63 or more, and still more preferably 0.65 or more.

Furthermore, $Al_2O_3 \times (MgO/(MgO+CaO+SrO+BaO))$ is preferably 5.5 or more. In the case where the ratio is less than 5.5, Young's modulus tends to decrease. The ratio is more preferably 5.75 or more, still more preferably 6 or more, and most preferably 6.25 or more.

It has been found in the non-alkali glass of the present invention that in the case where the relationship of each component, specifically the composition in terms of mol % on the basis of oxides, satisfies 759−13.1×SiO₂−7.5×Al₂O₃−15.5×B₂O₃+9.7×MgO+ 21.8×CaO+27.2×SrO+27.9×BaO≥0, the ranges of a thermal expansion rate and Young's modulus become ranges suitable for suppressing warpage.

The glass may further contain ZnO, $Fe_2O_3$, $SO_3$, F, Cl, and $SnO_2$ that have the effect of improving its meltability, clarification, formability and the like, in the total amount of 2% or less, preferably 1% or less, and more preferably 0.5% or less, in addition to the above-mentioned components.

On the other hand, it is preferred that the glass does not substantially contain $P_2O_5$ in order to avoid the occurrence of property deterioration of a film of a metal, an oxide or the like formed on the surface of the glass plate. Furthermore, it is preferred that the glass does not substantially contain PbO, $As_2O_3$ and $Sb_2O_3$ in order to facilitate recycle of the glass.

Next, various properties of the above-mentioned non-alkali glass are described.

The glass has an average coefficient of thermal expansion ($\alpha$) at from 50° C. to 350° C. of 45×10⁻⁷/° C. or less. Therefore, thermal impact resistance is large and productivity in the production of a panel can be increased. The $\alpha$ is preferably 42×10⁻⁷/° C. or less, more preferably 41×10⁻⁷/° C. or less, and still more preferably 40×10⁻⁷/° C. or less. On the other hand, in the case where the $\alpha$ is too small, warpage during film formation increases. For this reason, the $\alpha$ is 32×10⁻⁷/° C. or more. The $\alpha$ is preferably 33×10⁻⁷/° C. or more, and more preferably 35×10⁻⁷/° C. or more.

The glass has Young's modulus (E) of 70 GPa or higher. Due to such high Young's modulus, the glass has high fracture toughness and is therefore suitable for use in a substrate for a large-sized display. The Young's modulus is preferably 75 GPa or higher, more preferably 78 GPa or higher, still more preferably 80 GPa or higher, and particularly preferably 83 GPa or higher. On the other hand, in the case where the Young's modulus is too high, cutting property of the glass is deteriorated. For this reason, the Young's modulus is 95 GPa or lower. The Young's modulus is preferably 90 GPa or lower, and more preferably 88 GPa or lower.

The $\alpha$ and E satisfy the following formula (1).

$$20\alpha + 7E \geq 1310 \tag{1}$$

Here, the unit of $\alpha$ is $10^{-7}$/° C., and the unit of E is GPa. In the case where the $\alpha$ and E satisfy the above formula (1), warpage due to heating is small even though a substrate is a large-sized substrate.

The glass has a temperature $T_2$ at which a glass viscosity $\eta$ reaches $10^2$ poises (dPa·s) of preferably 1,710° C. or lower. Melting becomes relatively easy when satisfying this requirement. The temperature $T_2$ is more preferably lower than 1,710° C., still more preferably 1,700° C. or lower, and further more preferably 1,690° C. or lower.

The glass has a temperature $T_4$ at which the glass viscosity $\eta$ reaches $10^4$ poises of preferably 1,320° C. or lower, and therefore is suitable for use in float molding. The temperature $T_4$ is more preferably 1,315° C. or lower, still more preferably 1,310° C. or lower, and further more preferably 1,305° C. or lower.

The glass has a strain point of preferably 680° C. or higher, more preferably 710° C. or higher, and still more preferably 730° C. or higher.

For the same reason as in the strain point, the glass has a glass transition temperature of preferably 760° C. or higher, more preferably 770° C. or higher, and still more preferably 780° C. or higher.

The glass has a specific gravity of preferably 2.65 or less, more preferably 2.64 or less, and still more preferably 2.62 or less.

The glass has a devitrification temperature of preferably 1,350° C. or lower. Forming by a float process becomes easier when satisfying this requirement. The devitrification temperature is more preferably 1,340° C. or lower, and still more preferably 1,330° C. or lower. The devitrification temperature in the present invention is a temperature at which crystals precipitated on the surface and inside of a glass are observed with an optical microscope after a heat treatment in which pulverized glass grains are placed on a platinum dish and subjected to the heat treatment in an electric furnace controlled to a constant temperature for 17 hours.

The glass has a photoelastic constant of preferably 31 nm/MPa/cm or less. If a glass substrate has a birefringence due to a stress generated during a production process of a liquid crystal display panel or during use of a liquid crystal display device, a phenomenon that the contrast of a liquid display decreases such that black display changes to gray is sometimes observed. By adjusting the photoelastic constant to 31 nm/MPa/cm or less, this phenomenon can be suppressed. The photoelastic constant is more preferably 30 nm/MPa/cm or less, still more preferably 29 nm/MPa/cm or less, further more preferably 28.5 nm/MPa/cm or less, and particularly preferably 28 nm/MPa/cm or less. Considering easiness of securing other properties, the glass has the photoelastic constant of preferably 23 nm/MPa/cm or more, and more preferably 25 nm/MPa/cm or more. The photoelastic constant can be measured by a method of compression on circular plate.

The glass has a dielectric constant of preferably 5.6 or more. In the case of an in-cell type touch panel (touch sensor is stored in a liquid crystal display panel) as described in JP-A-2011-70092, a dielectric constant of a glass substrate is better to be high from the standpoints of improvement of sensitivity of the touch sensor, decrease of driving voltage and power saving. By adjusting the dielectric constant to 5.6 or more, sensitivity of the touch sensor is enhanced. The dielectric constant is more preferably 5.8 or more, and still more preferably 6.0 or more. Considering suppression of display quality deterioration (crosstalk) of an image on a liquid crystal display, increase of consumption of power and difficulty of achieving high definition, the dielectric constant is preferably 7.5 or less, more preferably 7 or less, and still more preferably 6.5 or less. The dielectric constant can be measured by the method defined in JIS C-2141.

The liquid crystal display panel of the present invention is an active matrix drive-type panel containing a substrate formed of the above-mentioned non-alkali glass, and a switching element such as TFT provided on the substrate. The substrate has a long side of 1,800 mm or larger and a short side of 1,500 mm or larger. The long side is preferably 2,100 mm or larger and the short side is preferably 1,800 mm or larger. The long side is more preferably 2,400 mm or larger and the short side is more preferably 2,100 mm or larger. The substrate has a thickness of 0.5 mm or smaller, preferably 0.4 mm or smaller, and more preferably 0.3 mm or smaller. The upper limit of each side and the lower limit of the thickness in the substrate are not particularly limited. For example, the long side is 3,200 mm or smaller, the short side is 2,900 mm or smaller, and the thickness is 0.05 mm or larger.

A wiring film formed of a metal and an insulating film containing an inorganic substance are provided on at least one surface of the substrate. In the present invention, pattern misalignment is suppressed from the standpoint of the combination of various properties of those films and the non-alkali glass.

The wiring film constitutes a circuit pattern including a gate electrode, a gate bus line, an auxiliary capacity wiring, an auxiliary capacity electrode, and the like. The wiring film has a thickness of 0.1 μm or larger. The upper limit of the thickness is not particularly limited, but is actually about 0.3 μm to 0.6 μm. In the case where the wiring film has this thickness, it is possible to form the gate bus line as a thin wire having a width of about from 4 μm to 10 μm.

The metal has the product of Young's modulus and a thermal expansion coefficient at room temperature of from $10,000 \times 10^{-7}$ GPa/° C. to $25,000 \times 10^{-7}$ GPa/° C., preferably from $10,000 \times 10^{-7}$ GPa/° C. to $24,000 \times 10^{-7}$ GPa/° C., and more preferably from $10,000 \times 10^{-7}$ GPa/° C. to $22,000 \times 10^{-7}$ GPa/° C. The metal having the product outside this range tends to increase warpage of a glass substrate after film formation of the wiring film.

Examples of the metal include copper, aluminum, molybdenum, titanium, chromium, tantalum, tungsten, and alloys of those. The gate electrode may have a laminate structure of those metals. The metal used is preferably copper, aluminum, molybdenum or alloys of those, and more preferably copper, aluminum or molybdenum.

The products of Young's modulus and a thermal expansion coefficient at room temperature of those metals are shown below.

Copper: 21,000 to $23,000 \times 10^{-7}$ GPa/° C.
Aluminum: 16,000 to $17,000 \times 10^{-7}$ GPa/° C.
Molybdenum: 15,000 to $17,000 \times 10^{-7}$ GPa/° C.

The substrate has an insulating film containing an inorganic substance, covering the circuit pattern. The insulating film has a thickness of 100 nm or larger. The upper limit of the thickness is not particularly limited, but is actually about 300 nm to 400 nm.

The inorganic substance has an average coefficient of thermal expansion (50° C. to 350° C.) smaller than the average coefficient of thermal expansion (a) of the non-alkali glass, that is, $32 \times 10^{-7}$/° C. to $45 \times 10^{-7}$/° C. Examples of the inorganic substance include silicon oxide, silicon nitride, silicon oxynitride, aluminum oxide, aluminum nitride, and aluminum oxynitride. Those may be used as a single layer or a laminated structure. Silicon nitride, silicon oxide or silicon oxynitride is preferably used. Average coefficients of thermal expansion of those are, for example, shown below.

Silicon nitride: $32 \times 10^{-7}$/° C.
Silicon oxide: $5.5 \times 10^{-7}$/° C.

It is considered that a thermal expansion coefficient of silicon oxynitride is a value between the above values depending on an oxygen/nitrogen ratio.

It is known that film stress varies by controlling film forming conditions, and it is possible to appropriately reduce warpage of a glass substrate by changing film stress. However, in the case of a metal film for a gate electrode, an output applied during film forming becomes too large, and the possibility of abnormal discharge becomes high. In the case of a gate insulating film, hydrogenation or the like can be employed, but there is a possibility that a transistor having desired properties is not obtained. For these reasons, in the case where there is the restriction on film forming conditions or in the case where warpage is desired to be further suppressed, it is possible to effectively suppress warpage by using the predetermined glass substrate of the present invention.

In the case where a liquid crystal display panel becomes to have high definition, a metal wiring film becomes narrow. Therefore, a thickness of the metal wiring film increases in order to maintain a resistance value. A circuit pattern of the metal wiring film is formed on a glass substrate, and an insulating film covers spaces among the wirings and surfaces of the wirings, and is formed on almost the entire surface of the glass substrate. In this case, it has been found that warpage occurs in the state that the glass substrate, metal wiring film and insulating film are integrated together, during a heat treatment in a production process due to the difference in the respective thermal expansion coefficient and Young's modulus among the glass substrate, the metal wiring film having increased thickness and the insulating film. Particularly, it has been found that in the case where the circuit pattern of the metal wiring film shifts in mainly a vertical direction or a horizontal direction, warpage tends to occur remarkably. When warpage occurs in the glass substrate, pattern misalignment from the originally designed positions of a wiring and an element is easy to occur.

An active layer of TFT, a passivation film, a flattened film and the like are provided on an upper side of the insulating film to form a TFT substrate. The TFT substrate can be produced by a convention production process, and for example, a maximum temperature in the production process is preferably 450° C. or lower. The maximum temperature is generally the maximum temperature in the formation process of the active layer of TFT. Depending on the kind of a semiconductor used and a process applied, the maximum temperature may be more preferably 400° C. or lower, still more preferably 370° C. or lower, and further more preferably 350° C. or lower in some cases. Considering the production process and stability of TFT performance, the maximum temperature is preferably 200° C. or higher, more preferably 250° C. or higher, and still more preferably 300° C. or higher. Examples of the semiconductor for the active layer include amorphous silicon (a-Si), and an oxide semiconductor of indium-gallium-zinc. The TFT may be a bottom gate type (inverse stagger type) and may be a top gate type (stagger type). However, an inverse stagger type in which a process of forming a metal film and an insulating film is conducted at the initial stage of a TFT production process in many cases is preferred in order to sufficiently exhibit the effect of the present invention. As the passivation film, flattened film and the like, conventional materials may be used.

The liquid crystal display panel of the present invention is an active matrix drive-type liquid crystal display panel. The liquid crystal display panel is a liquid crystal display panel that is produced by, for example, a production process including steps of film-forming a film formed of a metal on at least one surface of a substrate formed of a non-alkali glass, such as amorphous silicon (a-Si) and an oxide semiconductor of indium-gallium-zinc oxide, patterning the metal film to form a wiring film, and then film-forming a gate insulating film containing an inorganic substance. Specifically, the production process differs from a production process involving high temperature heat treatment, such as LTPS, and the maximum temperature of the production process of the liquid crystal display panel (liquid crystal display panel using amorphous silicon (a-Si) or an oxide semiconductor of indium-gallium-zinc type as TFT) in the present invention is a temperature of low temperature heat treatment, for example, 450° C. or lower. On at least one surface of the substrate formed of the non-alkali glass, the wiring film formed of the metal and the insulating film containing the inorganic substance are provided.

The TFT substrate is combined with a color filter substrate, liquid crystal molecules, a sealing material, a polarizing plate, a light-guiding plate, various optical films, a backlight and the like to form a liquid crystal display panel. The size of the display is appropriately selected depending on the use. For example, the display may be a panel for mobile display having a diagonal length of about 3 inches to 10 inches, or a display for 4K television having a diagonal length of 30 inches to 70 inches. The definition is preferably 100 pixel per inch (hereinafter referred to as "ppi") or more, more preferably 150 ppi or more, and still more preferably 200 ppi or more, in displays of 30 inches or more. The definition is preferably 300 ppi or more, more preferably 400 ppi or more, and still more preferably 500 ppi or more, in the use of a mobile display.

EXAMPLES

The present invention is described in more detail below by reference to Examples and Comparative Examples, but the present invention is not construed as being limited to those Examples.

Raw materials of each component were prepared such that each glass composition has the target glass composition (unit: mol %) shown in Table 1, and melted at a temperature of from 1,500 to 1,600° C. by using a platinum crucible. In melting, a glass was homogenized by stirring using a platinum stirrer. The molten glass was poured out, molded into a plate shape, and then annealed. Various evaluations were conducted by using each glass plate. In Table 1, Examples 1 to 4 and 7 to 12 are glasses of Examples of the present invention, and Examples 5 and 6 are glasses of Comparative Examples. The values in the parentheses show calculated values.

Table 1 shows a glass composition (unit: mol %), an average coefficient of thermal expansion at from 50° C. to 300° C. (unit: ×10$^{-7}$/° C.), a strain point (unit: ° C.), a glass transition point (unit: ° C.), a specific gravity (unit: g/cm$^3$), a Young's modulus (GPa) (measured by an ultrasonic method), a temperature $T_2$ providing an indication of meltability (temperature at which glass viscosity η reaches 10$^2$ dPa·s, unit: ° C.) and a temperature $T_4$ providing indications of float formability and fusion formability (temperature at which glass viscosity η reaches 10$^4$ dPa·s, unit: ° C.) as high temperature viscosity values, a devitrification temperature (unit: ° C.), a photoelastic constant (unit: nm/MPa/cm) (measured by a method of compression on circular plate), and a dielectric constant (measured by a method defined in JIS C-2141).

TABLE 1

| Mol % | Ex. 1 | Ex. 2 | Ex. 3 | Ex. 4 | Ex. 5 | Ex. 6 | Ex. 7 | Ex. 8 | Ex. 9 | Ex. 10 | Ex. 11 | Ex. 12 |
|---|---|---|---|---|---|---|---|---|---|---|---|---|
| SiO$_2$ | 66.8 | 67.1 | 66.3 | 70.2 | 66.1 | 68.6 | 70.0 | 67.0 | 68.0 | 68.0 | 66.0 | 68.0 |
| Al$_2$O$_3$ | 12.6 | 12.8 | 12.3 | 12.8 | 11.2 | 11.4 | 12.0 | 14.0 | 12.0 | 12.0 | 12.0 | 12.0 |
| B$_2$O$_3$ | 2.5 | 1.2 | 0.1 | 0.8 | 7.4 | 7.9 | 2.0 | 3.0 | 4.0 | 1.0 | 5.0 | 1.0 |
| MgO | 8.4 | 9.1 | 10.9 | 5.0 | 5.4 | 2.5 | 3.0 | 7.0 | 4.0 | 9.0 | 8.0 | 10.0 |
| CaO | 5.2 | 5.4 | 10.5 | 5.8 | 4.9 | 9.1 | 8.0 | 3.0 | 4.0 | 6.0 | 3.0 | 7.0 |
| SrO | 4.5 | 4.4 | 0 | 1.7 | 4.9 | 0.5 | 4.0 | 4.0 | 7.0 | 4.0 | 4.0 | 2.0 |
| BaO | 0 | 0 | 0 | 3.6 | 0 | 0 | 1.0 | 2.0 | 1.0 | 0 | 2.0 | 0 |
| ZrO$_2$ | 0 | 0 | 0 | 0 | 0 | 0 | 0 | 0 | 0 | 0 | 0 | 0 |
| MgO + CaO + SrO + BaO | 18.1 | 18.9 | 21.4 | 16.1 | 15.2 | 12.1 | 16.0 | 16.0 | 16.0 | 19.0 | 17.0 | 19.0 |
| MgO/(MgO + CaO + SrO + BaO) | 0.46 | 0.48 | 0.51 | 0.31 | 0.36 | 0.21 | 0.19 | 0.44 | 0.25 | 0.47 | 0.47 | 0.53 |
| MgO/(MgO + CaO) | 0.62 | 0.63 | 0.51 | 0.47 | 0.53 | 0.22 | 0.27 | 0.70 | 0.50 | 0.60 | 0.73 | 0.59 |

TABLE 1-continued

| | | | | | | | | | | | | |
|---|---|---|---|---|---|---|---|---|---|---|---|---|
| MgO/(MgO + SrO) | 0.65 | 0.68 | 1.00 | 0.75 | 0.52 | 0.83 | 0.43 | 0.64 | 0.36 | 0.69 | 0.67 | 0.83 |
| $Al_2O_3 \times (MgO/(MgO + CaO + SrO + BaO))$ | 5.8 | 6.1 | 6.3 | 4.0 | 4.0 | 2.3 | 2.3 | 6.1 | 3.0 | 5.7 | 5.6 | 6.3 |

| | Ex. 1 | Ex. 2 | Ex. 3 | Ex. 4 | Ex. 5 | Ex. 6 | Ex. 7 |
|---|---|---|---|---|---|---|---|
| Average coefficient of thermal expansion (50 to 350° C.) ($10^{-7}$/° C.) | 39 | 39 | 40 | 38 | 38 | 33 | (39.7) |
| Strain point (° C.) | 710 | 716 | | 746 | 670 | 667 | (721) |
| Glass transition point (° C.) | | | 792 | | | | |
| Specific gravity (g/cm³) | 2.59 | 2.59 | 2.55 | 2.59 | 2.5 | 2.4 | (2.57) |
| Young's modulus (GPa) | 84 | 85 | 91 | 83 | 77 | 73 | (81) |
| $T_2$ (° C.) | 1654 | 1654 | 1622 | 1746 | 1645 | 1692 | (1719) |
| $T_4$ (° C.) | 1295 | 1298 | 1281 | 1373 | 1275 | 1296 | (1339) |
| Devitrification temperature (° C.) | 1275 | 1285 | 1255 | | 1260 | | |
| Photoelastic constant (nm/MPa/cm) | 27 | 27 | 25 | 28 | 31 | | |
| Dielectric constant | 6.1 | 6.1 | | | 5.6 | 5.3 | |
| 20α + 7E | 1368 | 1375 | 1437 | 1341 | 1299 | 1171 | 1360 |
| $759 - 13.1 \times SiO_2 - 7.5 \times Al_2O_3 - 15.5 \times B_2O_3 + 9.7 \times MgO + 21.8 \times CaO + 27.2 \times SrO + 27.9 \times BaO$ | 68.6 | 90.0 | 131.3 | 52.0 | -12.7 | -112.2 | 61.2 |

| | Ex. 8 | Ex. 9 | Ex. 10 | Ex. 11 | Ex. 12 |
|---|---|---|---|---|---|
| Average coefficient of thermal expansion (50 to 350° C.) ($10^{-7}$/° C.) | (37.6) | (40.4) | (39.5) | (39.0) | (38.2) |
| Strain point (° C.) | (716) | (697) | (722) | (689) | (725) |
| Glass transition point (° C.) | | | | | |
| Specific gravity (g/cm³) | (2.60) | (2.60) | (2.57) | (2.59) | (2.54) |
| Young's modulus (GPa) | (82) | (78) | (86) | (79) | (87) |
| $T_2$ (° C.) | (1677) | (1696) | (1663) | (1659) | (1657) |
| $T_4$ (° C.) | (1317) | (1321) | (1305) | (1291) | (1299) |
| Devitrification temperature (° C.) | | | | | |
| Photoelastic constant (nm/MPa/cm) | | | | | |
| Dielectric constant | | | | | |
| 20α + 7E | 1328 | 1353 | 1394 | 1335 | 1377 |
| $759 - 13.1 \times SiO_2 - 7.5 \times Al_2O_3 - 15.5 \times B_2O_3 + 9.7 \times MgO + 21.8 \times CaO + 27.2 \times SrO + 27.9 \times BaO$ | 27.7 | 60.5 | 89.6 | 34.5 | 66.7 |

To confirm the effect of the present invention, deformation of the glass substrate was calculated by using a finite element method. MARC of MSC Co., Ltd. was used as calculation software, and the deformation was calculated in the following procedures. As step 1, substrate deformation was calculated in the case where the glass of Example 1 was used as a substrate having a substrate size G6 (long side: 1,800 mm, and short side: 1,500 mm) and a thickness of 0.5 mm, and a copper film having a thickness of 200 nm was coated thereon at 200° C. and then cooled to room temperature (20° C.). As step 2, to simulate patterning of width: 7 µm and pitch: 70 µm, substrate deformation was calculated in the case where anisotropy was given to the copper film such that Young's modulus in an axial end direction to a long axis direction of the substrate is 1/10 at room temperature. As step 3, substrate deformation was calculated in the case where the substrate to which anisotropy had been given in the step 2 was heated to 200° C., and a silicon nitride film was coated thereon in a thickness of 200 nm and then cooled to room temperature (20° C.). The product of Young's modulus and a thermal expansion coefficient of copper in the copper film at room temperature is from $21,000 \times 10^{-7}$ GPa/° C. to $23,000 \times 10^{-7}$ GPa/° C. An average coefficient of thermal expansion (50° C. to 350° C.) of silicon nitride is $32 \times 10^{-7}$/° C., and this is smaller than an average coefficient of thermal expansion of the glass.

The results calculated to the substrate formed of the glass (Young's modulus: 84 GPa, and a thermal expansion coefficient: $39 \times 10^{-7}$/° C.) of Example 1 are illustrated in (a) to (c) of FIG. 1 as contour views. In the step 1 ((a) of FIG. 1), the deformation is concentric deformation due to an isotropic film, but in the step 2 ((b) of FIG. 1), saddle deformation was observed due to anisotropy of the copper film. In the step 3 ((c) of FIG. 1), it was seen that deformation was reduced as compared with that in the step 2.

FIG. 2 is a graph obtained by plotting the maximum values of warpage of the substrates after film formation of a silicon nitride film, calculated by the method described above, in the case of assuming that the glasses of Examples 1 to 12 each were used as a glass substrate having a substrate size 6G (long side: 1,800 mm, and short side: 1,500 mm) and a thickness of 0.5 mm, the surface of each glass substrate was covered with copper patterns parallel to one direction having a thickness of 200 nm, a width of 7 μm and pitches of 70 μm, and a silicon nitride film having a thickness of 200 nm was formed in the entire surface of each glass substrate with covering the copper patterns. In this graph, warpage decreases toward the upper right and increases toward the lower left. The upper right portion of the straight line is an area corresponding to $20\alpha+7E \geq 1300$. As is seen from the graph, the glasses of Examples 1 to 4 and 7 to 12 satisfying the requirements of the present invention have small warpage and are hard to cause pattern misalignment. On the other hand, the glasses of Examples 5 and 6 that do not satisfy the glass composition and the formula (1) have large warpage, and it is therefore considered that pattern misalignment increases.

Although the present invention has been described in detail and by reference to the specific embodiments, it is apparent to one skilled in the art that various modifications or changes can be made without departing the spirit and scope of the present invention. This application is based on Japanese Patent Application (No. 2014-241601) filed on Nov. 28, 2014, the disclosure of which is incorporated herein by reference.

INDUSTRIAL APPLICABILITY

The liquid crystal display panel of the present invention is that pattern misalignment is remarkably suppressed due to the predetermined combinations of a substrate glass, a wiring metal, a dielectric substance, and a design embodiment of the display panel.

What is claimed is:

1. An active matrix drive-type liquid crystal display panel, comprising
a substrate of a non-alkali glass,
a wiring film comprising a metal formed on at least one surface of the substrate of the non-alkali glass, and
an insulating film comprising an inorganic substance formed on a surface of the wiring film,
wherein
the wiring film has a thickness of 0.1 μm or larger,
the insulating film has a thickness of 100 nm or larger,
the substrate has a long side of 1,800 mm or larger, a short side of 1,500 mm or larger, and a thickness of 0.5 mm or smaller,
the metal has a product of a Young's modulus and a thermal expansion coefficient at room temperature of from $10,000 \times 10^{-7}$ GPa/° C. to $25,000 \times 10^{-7}$ GPa/° C.,
the inorganic substance of the insulating film has an average coefficient of thermal expansion at a temperature of 50° C. to 350° C. smaller than that of the non-alkali glass,
the non-alkali glass has a Young's modulus E of from 84 GPa to 95 GPa and an average coefficient of thermal expansion a at a temperature of 50° C. to 350° C. of from $32 \times 10^{-7}$/° C. to $45 \times 10^{-7}$/° C., the Young's modulus E and the average coefficient of thermal expansion a of the non-alkali glass satisfy formula (1):

$$1377 \geq 20\alpha+7E \geq 1310 \quad (1),$$

wherein a unit of α is $10^{-7}$/° C. and a unit of E is GPa, and the non-alkali glass comprises, in terms of mol % on the basis of oxides:

| | |
|---|---|
| $SiO_2$ | 66 to 74, |
| $Al_2O_3$ | 10 to 12.8, |
| $B_2O_3$ | 0.1 or more and less than 3.0, |
| MgO | 2 to 10, |
| CaO | 3 to 11, |
| SrO | 0.1 to 10, |
| BaO | 0 to 5, and |
| $ZrO_2$ | 0 to 2, | wherein $Al_2O_3 \times MgO/(MgO+CaO+SrO+BaO)$ is 5.5 or more.

2. The liquid crystal display panel according to claim 1, wherein the non-alkali glass comprises, in terms of mol % on the basis of oxides:
$B_2O_3$ 0.1 to 1.5, and
wherein MgO/(MgO+SrO) is 0.69 or more.

3. The liquid crystal display panel according to claim 2, wherein the non-alkali glass has a composition in terms of mol % on the basis of oxides, satisfying the relationship of:

$$759-13.1 \times SiO_2-7.5 \times Al_2O_3-15.5 \times B_2O_3+9.7 \times MgO+21.8 \times CaO+27.2 \times SrO+27.9 \times BaO \geq 0.$$

4. The liquid crystal display panel according to claim 2, wherein the metal is selected from the group consisting of copper, aluminum and molybdenum.

5. The liquid crystal display panel according to claim 2, wherein the inorganic substance is selected from the group consisting of silicon nitride, silicon oxide and silicon oxynitride.

6. The liquid crystal display panel according to claim 2, which is obtained at a maximum temperature of 450° C. or lower.

7. The liquid crystal display panel according to claim 1, wherein the non-alkali glass comprises, in terms of mol % on the basis of oxides:
SrO 4.0 to 10, and
BaO 1.0 to 5.

8. The liquid crystal display panel according to claim 7, wherein the non-alkali glass has a composition in terms of mol % on the basis of oxides, satisfying the relationship of:

$$759-13.1 \times SiO_2-7.5 \times Al_2O_3-15.5 \times B_2O_3+9.7 \times MgO+21.8 \times CaO+27.2 \times SrO+27.9 \times BaO \geq 0.$$

9. The liquid crystal display panel according to claim 7, wherein the metal is selected from the group consisting of copper, aluminum and molybdenum.

10. The liquid crystal display panel according to claim 7, wherein the inorganic substance is selected from the group consisting of silicon nitride, silicon oxide and silicon oxynitride.

11. The liquid crystal display panel according to claim 7, which is obtained at a maximum temperature of 450° C. or lower.

12. The liquid crystal display panel according to claim 1, wherein the non-alkali glass comprises, in terms of mol % on the basis of oxides:
SrO 0.1 to 2.0, and
BaO 0 to 1.0.

13. The liquid crystal display panel according to claim 12, wherein the non-alkali glass has a composition in terms of mol % on the basis of oxides, satisfying the relationship of:

$$759-13.1 \times SiO_2-7.5 \times Al_2O_3-15.5 \times B_2O_3+9.7 \times MgO+21.8 \times CaO+27.2 \times SrO+27.9 \times BaO \geq 0.$$

14. The liquid crystal display panel according to claim 12, wherein the metal is selected from the group consisting of copper, aluminum and molybdenum.

15. The liquid crystal display panel according to claim 12, wherein the inorganic substance is selected from the group consisting of silicon nitride, silicon oxide and silicon oxynitride.

16. The liquid crystal display panel according to claim 12, which is obtained at a maximum temperature of 450° C. or lower.

17. The liquid crystal display panel according to claim 1, wherein MgO+CaO+SrO+BaO is 19.0 or more.

18. The liquid crystal display panel according to claim 17, wherein the non-alkali glass has a composition in terms of mol % on the basis of oxides, satisfying the relationship of:

$$759-13.1 \times SiO_2-7.5 \times Al_2O_3-15.5 \times B_2O_3+9.7 \times MgO+21.8 \times CaO+27.2 \times SrO+27.9 \times BaO \geq 0.$$

19. The liquid crystal display panel according to claim 17, wherein the metal is selected from the group consisting of copper, aluminum and molybdenum.

20. The liquid crystal display panel according to claim 17, wherein the inorganic substance is selected from the group consisting of silicon nitride, silicon oxide and silicon oxynitride.

21. The liquid crystal display panel according to claim 17, which is obtained at a maximum temperature of 450° C. or lower.

22. The liquid crystal display panel according to claim 1, wherein the non-alkali glass comprises, in terms of mol % on the basis of oxides:
SiO$_2$ 68.0 to 74, and
BaO 0 to 3.6.

23. The liquid crystal display panel according to claim 22, wherein the non-alkali glass has a composition in terms of mol % on the basis of oxides, satisfying the relationship of:

$$759-13.1 \times SiO_2-7.5 \times Al_2O_3-15.5 \times B_2O_3+9.7 \times MgO+21.8 \times CaO+27.2 \times SrO+27.9 \times BaO \geq 0.$$

24. The liquid crystal display panel according to claim 22, wherein the metal is selected from the group consisting of copper, aluminum and molybdenum.

25. The liquid crystal display panel according to claim 22, wherein the inorganic substance is selected from the group consisting of silicon nitride, silicon oxide and silicon oxynitride.

26. The liquid crystal display panel according to claim 22, which is obtained at a maximum temperature of 450° C. or lower.

27. The liquid crystal display panel according to claim 1, wherein the non-alkali glass comprises, in terms of mol % on the basis of oxides:
MgO 2 to 8.0, and
SrO 0.1 to 4.0, and
wherein MgO/(MgO+CaO+SrO+BaO) is 0.4 or more.

28. The liquid crystal display panel according to claim 27, wherein the non-alkali glass has a composition in terms of mol % on the basis of oxides, satisfying the relationship of:

$$759-13.1 \times SiO_2-7.5 \times Al_2O_3-15.5 \times B_2O_3+9.7 \times MgO+21.8 \times CaO+27.2 \times SrO+27.9 \times BaO \geq 0.$$

29. The liquid crystal display panel according to claim 27, wherein the metal is selected from the group consisting of copper, aluminum and molybdenum.

30. The liquid crystal display panel according to claim 27, wherein the inorganic substance is selected from the group consisting of silicon nitride, silicon oxide and silicon oxynitride.

31. The liquid crystal display panel according to claim 27, which is obtained at a maximum temperature of 450° C. or lower.

32. The liquid crystal display panel according to claim 1, wherein the non-alkali glass has a composition in terms of mol % on the basis of oxides, satisfying the relationship of:

$$759-130.1 \times SiO_2-7.5 \times Al_2O_3-150.5 \times B_2O_3+9.7 \times MgO+21.8 \times CaO+27.2 \times SrO+27.9 \times BaO \geq 0.$$

33. The liquid crystal display panel according to claim 1, wherein the metal is selected from the group consisting of copper, aluminum and molybdenum.

34. The liquid crystal display panel according to claim 1, wherein the inorganic substance is selected from the group consisting of silicon nitride, silicon oxide and silicon oxynitride.

35. The liquid crystal display panel according to claim 1, which is obtained at a maximum temperature of 450° C. or lower.

36. A substrate formed of a non-alkali glass used in the liquid crystal display panel described in claim 1.

37. A substrate formed of a non-alkali glass used in the liquid crystal display panel described in claim 2.

38. A substrate formed of a non-alkali glass used in the liquid crystal display panel described in claim 7.

39. A substrate formed of a non-alkali glass used in the liquid crystal display panel described in claim 12.

40. A substrate formed of a non-alkali glass used in the liquid crystal display panel described in claim 17.

41. A substrate formed of a non-alkali glass used in the liquid crystal display panel described in claim 22.

42. A substrate formed of a non-alkali glass used in the liquid crystal display panel described in claim 27.

* * * * *